(12) United States Patent
Migita

(10) Patent No.: US 7,068,489 B2
(45) Date of Patent: Jun. 27, 2006

(54) ELECTROSTATIC CHUCK FOR HOLDING WAFER

(75) Inventor: Yasushi Migita, Kokubu (JP)

(73) Assignee: Kyocera Corporation, Kyoto (JP)

( * ) Notice: Subject to any disclaimer, the term of this patent is extended or adjusted under 35 U.S.C. 154(b) by 426 days.

(21) Appl. No.: 10/353,834

(22) Filed: Jan. 28, 2003

(65) Prior Publication Data
US 2003/0161088 A1    Aug. 28, 2003

(30) Foreign Application Priority Data
Jan. 28, 2002    (JP)    ............. P2002-019015

(51) Int. Cl.
*H01T 23/00*    (2006.01)
(52) U.S. Cl. .................. 361/234; 361/230
(58) Field of Classification Search ............ 361/230, 361/231, 232, 233, 234
See application file for complete search history.

(56) References Cited

U.S. PATENT DOCUMENTS

| | | | |
|---|---|---|---|
| 5,530,616 A | | 6/1996 | Kitabayashi et al. |
| 5,583,736 A | * | 12/1996 | Anderson et al. ........... 361/234 |
| 5,631,803 A | * | 5/1997 | Cameron et al. ........... 361/234 |
| 6,028,762 A | * | 2/2000 | Kamitani ................... 361/234 |
| 6,268,994 B1 | * | 7/2001 | Logan et al. ............... 361/234 |
| 6,643,115 B1 | * | 11/2003 | Sakaue et al. .............. 361/234 |
| 6,960,743 B1 | * | 11/2005 | Hiramatsu et al. ........ 219/444.1 |

FOREIGN PATENT DOCUMENTS

| | | |
|---|---|---|
| JP | 5-347352 | 12/1993 |
| JP | 6-342842 | 12/1994 |
| JP | 07-086385 | 3/1995 |
| JP | 9-213777 | 8/1997 |
| JP | 9-249465 | 9/1997 |
| JP | 2001-168177 | 6/2001 |
| JP | 2001-338970 | 12/2001 |
| WO | 01/04945 | 1/2001 |

* cited by examiner

*Primary Examiner*—Brian Sircus
*Assistant Examiner*—Danny Nguyen
(74) *Attorney, Agent, or Firm*—Hogan & Hartson, LLP

(57) ABSTRACT

An electrostatic chuck for holding a wafer includes a ceramic plate of which one main surface is formed to work as a mounting surface for mounting the wafer, and electrostatic attraction electrodes formed on a lower surface of the ceramic plate or in the ceramic plate. A recess portion having a depth in a range of from 3 to 10 μm is formed on one main surface of the ceramic plate excluding an outer peripheral portion thereof. The waviness of a top face of the outer peripheral portion is set to 1 to 3 μm, a gas groove is provided to a peripheral portion of a bottom surface of the recess-portion bottom surface, and electrostatic attraction electrodes are disposed in the ceramic plate disposed below the bottom surface of the convex portion. In the electrostatic chuck thus constructed, a high wafer-dechucking sensitivity can be exhibited.

5 Claims, 11 Drawing Sheets

ELECTROSTATIC CHUCK FOR HOLDING WAFER

BACKGROUND OF THE INVENTION

1. Field of the Invention

The invention relates to an electrostatic chuck for attractively holding a wafer such as a semiconductor wafer thereon.

2. Prior Art

Conventionally, electrostatic chucks are used for accurately holding and positioning a semiconductor wafer (which hereinbelow will shortly be referred to as a "wafer") thereon, primarily in a semiconductor manufacturing systems which include various deposition apparatuses (for example, for PVD, CVD, or plasma CVD processes) and etching apparatuses (for example, for plasma etching or optical etching).

Processes in many semiconductor-manufacturing apparatuses are often performed under a vacuum. In deposition apparatuses, reactive gas used in the process of deposition often heats a wafer on a chuck and causes the wafer to have a non-uniform temperature distribution on its surface, thereby in some cases, resulting in a deterioration in wafer qualities.

Also, wafers are heated by plasma gaseous etchant in etching apparatuses, or with ultraviolet or visible light illuminated in patterned photo-projection etching so that a temperature distribution over the wafer surface is made non-uniform, thereby causing variations in etching rate to an extent that the overall surface of the wafer cannot be uniformly etched. A problem of how to implement a uniform temperature distribution over the wafer surface has been held without resolution.

FIG. 11 shows a conventional electrostatic chuck disclosed in Japanese Patent Publication No. 07-153825. in which a conventional electrostatic chuck has a ceramic palate, an electrostatically attracting electrode 23 which is embedded in the ceramic plate 22, and many protrusions 24 which are provided over the upper surface of the ceramic plate 22. The chuck has an annular outer-peripheral portion 25, surrounding the protrusions 24, with the same level as that of the protrusion 24 and with a width 8 of 1 to 5 mm. According to the technique disclosed in the above publication, where a wafer W is mounted over the tops of the outer-peripheral portion 25 and of the protrusions 24, an electrostatic force is generated in a state where a voltage is applied between the wafer W and the electrode 23, thereby, attracting and fixedly supporting the wafer W onto the top faces of the protrusions 24 and the outer-peripheral convex portion 25. In etching or patterning treatment processes, heat-conductive gas such as helium is supplied into a space formed between the water W and the upper surface of the ceramic plate 22 to enhance heat conductivity between the wafer W and the electrostatic chuck and uniformize a temperature distribution on the overall surface of the wafer W.

In addition, FIG. 12 shows an electrostatic chuck 31 disclosed in Japanese Patent Publication No. 07-086385, in which, referring to the drawings, is provided with a metal plate 32 functioning as an electrostatic attraction electrode, and a recess portion 33 formed on an upper surface of the plate 32 except an outer peripheral portion 34. Further, a dielectric layer 35 is adhesively stacked over the upper surface including the recess portion 33 of the metal plate 32. The recess portion 33 has a depth r in a range of from several tens of micrometers to 0.1 mm or 0.2 mm. The depth r is a distance from a dielectric layer surface 35a on the top face of the outer peripheral portion 34 to a dielectric layer surface 35b on a bottom surface of the recess portion 33.

In use of the electrostatic chuck, a voltage is applied between the plate 32 and a wafer W whose peripheral portion is placed over the dielectric layer surface 35a on the top face of the outer peripheral portion 34. Thereby, only the peripheral portion of the wafer W is attracted and fixedly set onto the dielectric layer surface 35a on the top face of the outer peripheral portion 34. Similarly to the above, a heat-conductive gas is supplied into a space formed between the wafer W and the recess portion 33 of the plate to enhance heat conductivity between the wafer W and the electrostatic chuck 31, and the temperature distribution over-the wafer W is thereby intended to be made uniform.

However, the electrostatic chuck according to Japanese Patent Publication No. 07-153825 attractively holds the wafer W via the top surfaces of the many protrusions 24 together with an outer-peripheral portion 25 so that an wafer W with a flection or warp cannot perfectly attracted on the chuck while such a warped wafer is only partly attracted thereon, resulting in lack of attraction force to the wafer, thereby causing, for example, migrating of the wafer on the chuck, or in some cases, falling of the wafer from the chuck stage.

In this prior chuck, while the inner region in the outer-peripheral portion 25 is may be an attraction region, no electrostatic force is generated between the outer-peripheral portion 25 and the wafer W, since the electrostatic attraction electrode 23 buried has not reached a portion immediate beneath the outer-peripheral portion 25. Consequently, when a wafer W deformed with a flection or warp is mounted on the chuck, many gaps are developed between the wafer W and the top face of the outer-peripheral portion 25 and unexpectedly allow the heat-conductive gas to leak from the space under the wafer, which reduces a degree of vacuum in a semiconductor manufacturing apparatus, adversely affecting dimensional precision of deposited films and etched patterns formed in films.

Also, the electrostatic chuck 31 disclosed in Japanese Patent Publication No. 07-86385 poses problems as follows. In the electrostatic chuck 31, the large recess 33 is provided in the central portion, with only the stepped portion of the outer peripheral portion 34 around the recess portion 33 used to attractively hold the wafer W, and since the attraction force is small, a supply pressure of the heat conductive gas supplied into the space between the wafer W and the recess portion 33 causes a gap partly between an outside of the wafer W and a top face of the outer peripheral portion 34,. The resulting gap allows a leakage of the heat-conductive gas, thereby reducing a vacuum during processing and adversely affecting dimensional of fabricated films thereon As described above, in the etching, a wafer is heated by a plasma etching gas, ultraviolet light, and visible light in photo-excited etching. As such, research has been conducted regarding how to cause heat exerted on the water to be escaped or transferred away.

To overcome these problems described above, a technique has been proposed that uses an electrostatic chuck to which a base member including a cooling mechanism is adhered.

FIG. 13 shows another conventional electrostatic chuck 51 including a wafer-holding member 52. The wafer-holding member 52 includes a disc-shaped ceramic plate 53 and an electrostatic attraction electrode 56. One main surface of the ceramic plate 53 is formed as a mounting surface 54 for mounting a wafer W, and the electrostatic attraction electrode 56 is formed on the other main surface 55 of the ceramic plate 53. In addition, the electrostatic chuck 51 includes a base member 57 adhered via an adhesive layer 59 onto a surface on an opposite side of the mounting surface 54 of the ceramic plate 53.

A base member 57 includes fluid paths 58 through which a cooling gas and a cooling water flows. Thereby, the base member 57 is cooled, and heat exerted on the wafer W attractively held to the wafer-holding member 52 is thereby absorbed.

In addition, FIG. 14 shows another electrostatic chuck 51. In the electrostatic chuck 51, one main surface of a disc-shaped ceramic plate 53 is formed as a mounting surface 54 for mounting a wafer W, and a base member 57 is adhered via an adhesive layer 59 on the side opposing a mounting surface 54 of a wafer-holding member 52 embedded the electrostatic attraction electrode 56 in the ceramic plate 53. Also in the electrostatic chuck 51, similar to the electrostatic chuck 51 shown in FIG. 13, a cooling gas and a cooling water are supplied to flow along fluid paths 58 formed in the base member 57. Thereby, the base member 57 is cooled, and heat exerted on the water W attractively held to the wafer-holding member 52 is dissipated.

In the individual wafer-holding members shown in FIGS. 13 and 14, the mounting surface of the planner ceramic body is prepared and finished to substantially the same surface roughness as that of the other main surface to prevent the wafer-holding member from warping (refer to Japanese Patent Publication No. 2001-168177).

However, as described above, the temperature on the side of the mounting surface 54 of the wafer-holding member 52 is increased by various processes, whereas the temperature of the surface on the opposite side of the mounting surface 54 of the wafer-holding member 52 has been decreased by the cooling mechanism of the base member 57. This causes warpage in the ceramic plate 53, thereby deforming a central portion of the ceramic plate 53 to be convex toward the mounting surface 54. Consequently, since the flatness of the mounting surface 54 is reduced at the time of various water processes, processing accuracy for the wafer W cannot be enhanced. In particular, the thinner the thickness of the ceramic plate 53 forming the wafer-holding member 52; the more conspicuous the warpage of the planner ceramic body appears.

In order to increase the attraction force of the wafer-holding member 52, the distance between the mounting surface 54 and the electrostatic attraction electrode 56 needs to be reduced as possible. In the example shown in FIG. 13, ordinarily, a ceramic plate 53 having a thickness in a range of from 0.5 to 3.0 mm was used.

In the example shown in FIG. 14, since the wafer-holding member 52 is formed such that the electrostatic attraction electrode 56 is embedded in the ceramic plate 53, a ceramic plate having a reduced thickness in a range of from 2.0 to 5.0 mm is used for the planar ceramic body 53 in order to dissipate the heat exerted on the wafer W attractively held on the mounting surface 54 easily. There arises a problem that thin ceramic plates having a thickness not greater than 5.0 mm are apt to be warped.

SUMMARY OF THE INVENTION

An object of the present invention is to provide an electrostatic chuck which is capable of firmly attracting even a wafer including a flection or warp on the chuck and of performing a uniform wafer-surface temperature distribution.

Another object of the present invention is to provide an electrostatic chuck which suppresses leakage of a cooling or heating gas from between a wafer and a ceramic plate and has superior sensitivity of electrostatic chucking and dechucking of a wafer to the chuck.

Still another object of the invention is to provide an electrostatic chuck which deals with a thin ceramic plate and causes such a thin ceramic plate to be less warped.

An electrostatic chuck of the present invention includes a ceramic plate having a main surface which is a mounting surface for mounting the wafer, and electrostatic attraction electrode formed on the other main surface of the ceramic plate or within the ceramic plate, wherein the mounting surface of the ceramic plate containing an outer peripheral portion, a recess portion having a depth in a range of from 3 to 10 µm with respect to the outer peripheral portion, and a gas groove in a peripheral portion of the recess-portion, and a top face of the outer peripheral portion comprises waviness having a wave height in a range of from 1 to 3 µm.

In the electrostatic chuck, preferably, the distance from an outermost peripheral portion to the outer peripheral portion in an occupational region of the electrostatic attraction electrodes is in a range of from 5 to 10 mm.

An electrostatic chuck for holding a wafer of the present invention comprises a ceramic plate of which one main surface is formed as a mounting surface for mounting the wafer, electrostatic attraction electrodes formed on the other main surface of the ceramic plate or in the ceramic plate, and a base member that comprises a cooling function and that is adhered to an opposite side of the mounting surface of the ceramic plate, wherein an surface roughness A, in arithmetic mean surface roughness Ra, of the mounting surface of the ceramic plate and an surface roughness B, in arithmetic mean surface roughness Ra, of the other main surface of the ceramic plate satisfy a relation represented by;

$A<B$; and concurrently $0.500<(B-A)/B \leq 0.998$.

In the electrostatic chuck, the arithmetic mean surface roughness (Ra) A of the mounting surface is preferably 1.5 µm or less.

BRIEF DESCRIPTION OF THE DRAWINGS

The present invention will be described in detail below with reference to the accompanying drawings, in which.

DETAIL DESCRIPTION OF THE PRESENT INVENTION

Embodiment 1

Figure 1:
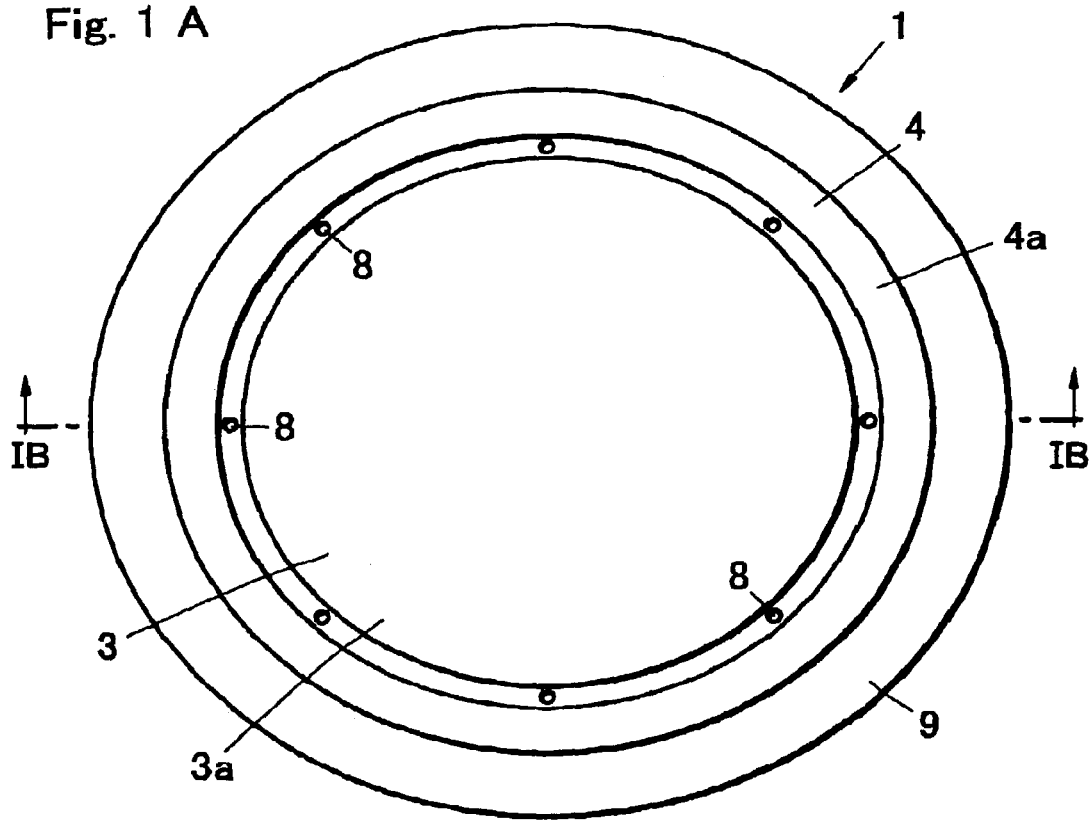
FIG. 1A is a plan view of an electrostatic chuck according to an embodiment of the present invention.
FIG. 1B is a vertical cross-sectional view of the electrostatic chuck shown in FIG. 1A.
Figure 1:
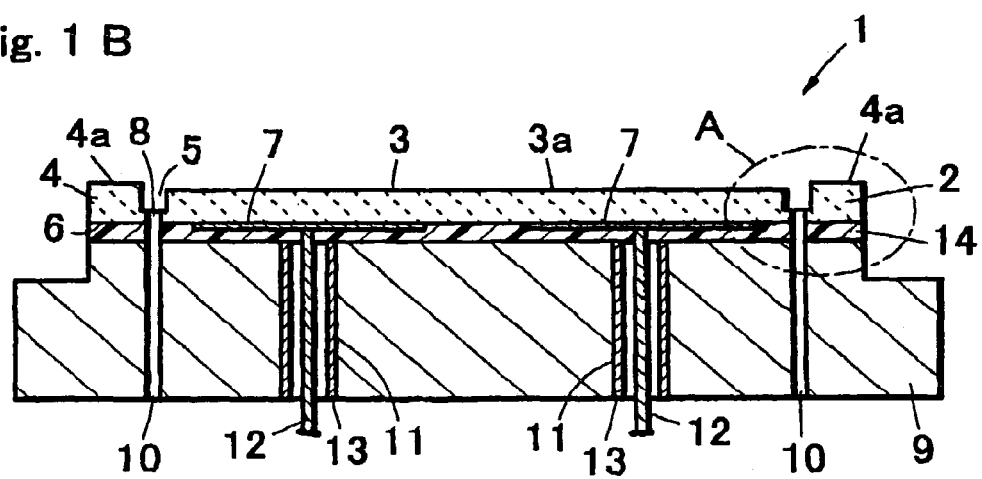
Figure 2:
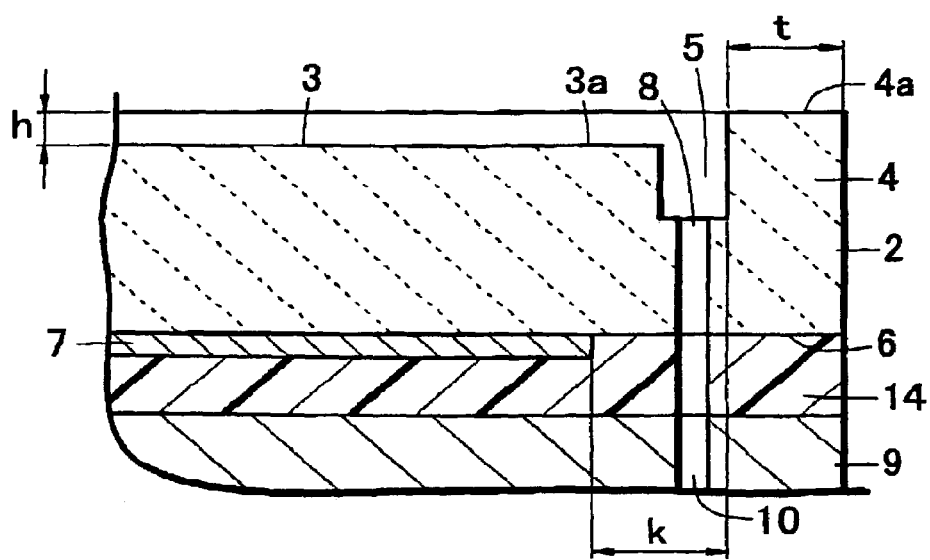
FIG. 2 is a partially-enlarged cross-sectional view of the electrostatic chuck according to the embodiment of the present invention.

An electrostatic chuck 1 of this embodiment according to the present invention include a ceramic plate having a mounting surface on one main surface thereof, and a attractive electrode buried within the ceramic plate or attached on the other main surface, a recess portion 3 shaped circular as viewed in a plan view is formed on the one main surface except fox an outer peripheral portion 4 of a disc-shaped ceramic plate 2 having the substantially same size as a wafer. A top face of the outer peripheral portion 4 is used as a second holding surface 4a.

In this embodiment, a gas groove 5 is provided on a peripheral portion on a bottom surface of the recess portion 3 (which hereinbelow will be referred to as a "recess-portion bottom surface") that is surrounded by the gas groove 5 is used as a first holding surface 3a. A pair of semicircular electrostatic attraction electrodes 7 are formed on an other main surface 6 of the ceramic plate 2 provided below the recess-portion bottom surface.

The ceramic plate 2 may include a sinter of alumina, silicon nitride, aluminum nitride, or yttrium aluminum garnet (YAG), or an single crystal of alumina (sapphire). Particularly, an aluminum-nitride-based sinter is preferable in terms of enhancing thermal uniformity of a wafer since it has a high thermal conductivity of at least 50 W/m·k (preferably, at least 100 W/m·k). In addition, unlike a sintered ceramic, single crystalline alumina (sapphire) does not cause voids or spalls, which is particularly suitable for use in applications where particle generation should be inhibited.

The first holding surface 3a is a flat surface parallel to the other main surface 6 of the ceramic plate 2. In addition, the first holding surface 3a, which influences the electrostatic force, is disposed with a predetermined constant distance to the electrostatic attraction electrode 7.

The outer peripheral portion 4A is a small projected portion formed around the one main surface of the ceramic plate 2, with a depth h of the recess portion 3 (a step from the second holding surface 4a to the first holding surface 3a) being set to a range of from 3 to 10 µm. The outer peripheral portion 4A has a waviness on the top face thereof, with a wave height set to a range of from 1 to 3 µm.

A plurality of gas-introducing holes 8 are formed open to the gas groove 5 on the ceramic plate 2. The gas-introducing holes 8 may introduce a heat-conductive gas such as helium into the gas groove 5 which gas therethrough may be delivered into a space formed between the recess portion 3 and a wafer to be placed on the portion 3.

In the electrostatic chuck 1 of this embodiment, a base member 9 is adhered to the other main surface of the ceramic plate 2, using an insulating adhesive layer 14 of a glass- or resin-based adhesive. The base member 9 may be of metal such as aluminum or stainless steel The base member 9 includes gas supply holes 10 and electrode-leading holes 11. The gas supply holes 10 individually communicating with the gas-introducing holes 8 of the ceramic plate 2.

The electrode-leading holes 11 are individually used to lead power feeders 12 electrically connected to the pair of electrostatic attraction electrodes 7. Insulation tubes 13 are individually provided inside the electrode-leading holes 11 to prevent short-circuiting between the slim power feeders 12 and the metal base member 9.

Figure 3:
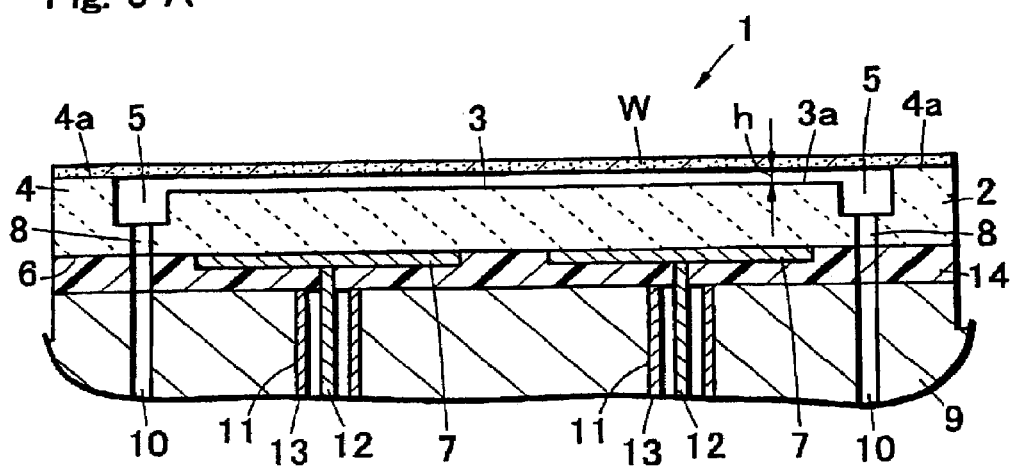
FIGS. 3A and 3B are cross-sectional view showing stages where the electrostatic chuck attracts and fixedly sets a wafer.
Figure 3:
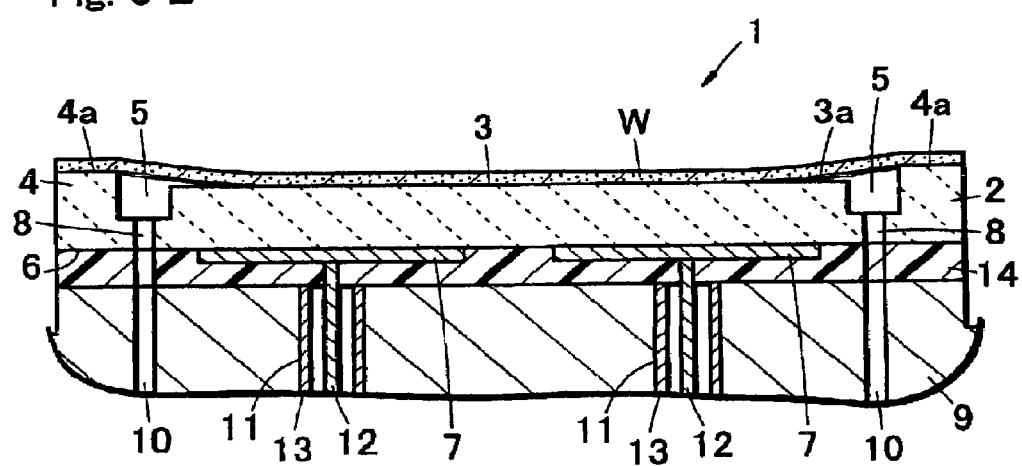

A wafer W can be fixedly set on the electrostatic chuck 1 in the following manner. As shown in FIG. 3A, in a state where the wafer W is mounted to abut the second holding surface 4a, which is the top face of the outer peripheral portion 4 of the ceramic plate 2, a voltage is applied between the power feeders 12. As a result, an electrostatic force is generated between the electrostatic attraction electrode 7 and the wafer W, and thereby, as shown in FIG. 3B, in a state where the circumference of the wafer W abuts the second holding surface 4a, which is the top face of the outer peripheral portion 4 of the ceramic plate 2, the center of the wafer W can be attracted in contact with the first holding surface 3a, which is the recess-portion bottom surface of the ceramic plate 2. Thus, in this embodiment, even a wafer W that is flexed or warped can be attracted atably on the chuck.

Further, in this embodiment, a heat conductive gas can be supplied from the gas-introducing holes 8 trough the gas groove 5 into the space formed between the recess portion 3 and a wafer which is mounted thereon, preventing the heat-conductive gas from leaking from between the circumference of the wafer W and the second holding surface 4a. At the same time, the temperature distribution over the surface of the wafer W can be made uniform. Deposition performed in this state of the wafer can produce a homogeneous film having a uniform thickness all over the wafer W. On the other hand, when etching is performed in the state described above, the thin film can be formed with high precision. Thus, the precision of individual processes an be enhanced.

As described above, according to the present invention, the greater part of the one main surface of the ceramic plate 2 contains a recess portion 3, except for an outer peripheral portion 4, and the recess-portion bottom surface is an attraction region. Thereby, a wafer W even including deformed portions can firmly be attracted and fixedly set.

When attracting a wafer W, the center of the wafer W is brought in contact with the first holding surface 3a, also, the circumference of the water W is brought in contact with the second holding surface 4a, and the heat-conductive gas can be supplied into a space formed between the wafer W and the recess portion.3. Thereby, since heat conductivity properties of the center and heat conductivity properties of the circumferential edge can be arranged similar to each other, the temperature distribution over the surface of the wafer W can be caused to be uniform.

In addition, since the center of the wafer W is attracted to the first holding surface 3a positioned lower than the second holding surface 4a, the wafer W can be attracted to engage tightly with an inner-peripheral edge portion of the second holding surface 4a. Concurrently, the wafer W can be brought in contact also with the second holding surface 4a. Therefore, the heat-conductive gas supplied into the space formed between the wafer W and the recess portion 3 can be prevented from leaking from the portion between the circumferential edge of the wafer W and the second holding surface 4a. There is no event where a vacuum would reduce due to the gas leakage during manufacturing processes.

In addition, according to the present invention, the electrostatic attraction electrodes 7 may be disposed only on an area of the other main surface 6 of the ceramic plate 2 which area corresponds to the recess-portion bottom surface used as the attraction region, but no electrostatic force from the second holding surface 4a is exerted to the wafer W so that residual attraction force can be quickly eliminated to be negligibly small once static electricity to the electrostatic attraction electrodes 7 is switched off and then the wafer forced to be bent to the recess portion is jerked back due to a resilient force of the wafer so as to quickly be removed from the chuck.

When the electrostatic chuck 1 of this embodiment has attracted the wafer W, as shown in FIG. 3B, the wafer W is fixedly set in the state where the wafer W is bent with its center portion protruding downwardly. According to further studies, it is found that it is more important to provide a uniform temperature distribution over the surface of the wafer W than to enhance flatness of the wafer W.

As described above, in order to secure these advantages, it is preferable that the depth h of the recess portion 3 (i.e., a step of a second holding surface 4a with respect to a first holding surface 3a) be in a range of 3 to 10 μm, and that at the same time the waviness of the top face of the outer peripheral portion 4, which is the second holding surface 4a, be in a range of from 1 to 3 μm.

A depth h of the recess portion 3 exceeding 10 μm reduces the flatness of the wafer W at the time of attraction, a thickness of the deposited film being non-uniform over the wafer, with a deterioration in an etched pattern, which adversely affects degrees of precision in various post-processes. Also, the depth h is so large that an electrostatic attraction force may be made it insufficient to attractively hold the wafer W.

In contrast, at the depth h of the recess portion 3 set below 3 μm, when the waviness of the second holding surface 4a is 3 μm, the height of the lowest portion of the second holding surface 4a becomes substantially equal to the height of the first holding surface 3a. As a result, when the wafer is attracted, large gaps are created between the circumference of the wafer W and the second holding surface 4a. This leads to a problem in that the amount of leakage of the heat-conductive gas is excessively increased, and the vacuum is thereby decreased at the time of, for example, deposition or etching, consequently providing adverse effects on deposition precision or etching precision.

When the waviness of the top face of the outer peripheral portion 4 is less than 1 μm, the wafer W is held in such a manner to be adhered to an extent to the top of second holding surface 4a that it cannot quickly be separated from the chuck.

In contrast, when the waviness exceeds 3 μm, the circumference of the wafer W cannot follow the waviness on the top of the outer peripheral portion 4 and gaps are partly formed to the top, allowing heat-conductive gas to leak through the gaps.

The waviness on the lop face of the outer peripheral portion 4 refers to the difference between a maximum and a minimum of displacements which are measured by an out-of-roundness measuring instrument for the overall circumference, that is, the second holding surface 4a, of the outer peripheral portion 4.

A width t of the outer peripheral portion 4 is preferably in a range of from 1 to 10 mm. When the width t of the outer peripheral portion 4 is smaller than 1 mm, for example, fracturing or cracking tends to occur in an inner peripheral edge portion of the top face of the outer peripheral portion 4 at the time of forming the recess portion 3.

When fracturing or cracking has occurred, since the width t is thereby reduced, gaps are developed between the wafer W and the recess portion 3, and the heat-conductive gas tends to leak from these gaps. In contrast, when the width t of the outer peripheral portion 4 exceeds 10 mm, the wafer W cannot easily be bent with the center protruding downwardly at the time of attraction. When the wafer W is not bent, it cannot be attractively held to the recess-portion bottom surface serving as the first holding surface 3a; that is, the force of holding the wafer W is reduced. Concurrently, the heat-conductive gas supplied into the space formed between the wafer W and the recess portion 3 can easily leak from the portion between the circumferential edge of the wafer W and the second holding surface 4a.

However, the width t of the outer peripheral portion 4 need not completely be uniform throughout the overall circumference thereof.

The outer peripheral portion 4 may include uneven portions, such as narrow portions and wide portions. In this case, the width t may be set to 1 mm or greater for the narrow portions of the outer peripheral portion 4, and may be set to 10 mm or less for the wide portions of the outer peripheral portion 4.

To prevent leakage of the heat-conductive gas efficiently, the top surface of the outer peripheral portion 4, i.e., the second holding surface 4a, is finished smooth to a surface roughness not allowing gaps to be formed when the wafer W is attractively hold thereto. Specifically, the surface is preferably finished to an arithmetic mean surface roughness (Ra) of 0.6 μm or less.

The recess-portion bottom surface, that is, the first holding surface 3a, is preferably finished as smooth as possible since the surface contacts the wafer W. Specifically, the surface is preferably finished to an arithmetic mean surface roughness (Ra) of 1.2 μm or less A distance k from the outermost peripheral portion in an occupational region of the electrostatic attraction electrode 7 to an inner wall surface of the outer peripheral portion 4 is preferably in a range of from 5 to 10 mm.

With the distance k of 5 mm or shorter, the electrostatic attraction electrode 7 is positioned extending to the vicinity of a lower portion of the outer peripheral portion 4. In this case, when the wafer W is attracted, an electrostatic force is also generated between the wafer W and the second holding surface 4a. Thereby, since the residual attraction force at the time of dechucking of the wafer W is increased, the dechucking sensitivity of the wafer W is decreased. In contrast, with the distance k exceeding 10 mm, since the wafer W and first holding surface 3a are positioned excessively far away from one another, a sufficiently great electrostatic force cannot be obtained. Accordingly, since a force for pressing the circumferential edge of the wafer W to the second holding surface 4a is low, gaps are partly formed between the circumferential edge of the wafer W and the second holding surface 4a by the supply pressure of the heat-conductive gas supplied to a space composed of the wafer W and the recess portion 3. These gaps facilitate leakage of the heat-conductive gas.

The electrostatic chuck shown in FIGS. 1A and 1B is manufactured as described hereunder. The ceramic plate 2 having smoothly finished upper and lower surfaces is first prepared. Then, a conductive layer made of Ti, W, Mo, Ni or the like, or a carbide thereof is formed on the other main surface 6 of the ceramic plate 2 by using a film-forming means, such as an ion-plating, PVD, CVD, sputtering, and electrolytic plating techniques. Subsequently, unnecessary portions are removed by etching to obtain an electrostatic attraction electrode 7, for example, in the case of a twin electrode, of a pair of semicircular films arrayed.

When the recess portion 3 described below is formed, the outermost peripheral portion of the occupational region of the electrostatic attraction electrode 7 is preferably positioned away by a distance k of 5 to 10 mm from the inner wall surface of the outer peripheral portion 4.

Subsequently, the gas groove 5 and the gas-introducing holes 8 are formed by machining or blasting in predetermined positions of the one main surface of the ceramic plate 2. In addition, the power feeders 12 are connected to the electrostatic attraction electrode 7 via a conductive adhesive.

Then, the base member 9 is adhered to the ceramic plate 2 on the other side of the main surface thereof, via the insulating adhesive layer 14 formed of a glass- or resin-based adhesive or the like. Thereafter, the recess portion 3 having a depth h of 3 to 10 µm is formed on the one main surface of the ceramic plate 2 excluding the outer peripheral portion 4 thereof. The recess portion 3 is finished so that the waviness of the top face of the outer peripheral portion 4 is in a range of from 1 to 3 µm. In this manner, the electrostatic chuck 1 shown in FIGS. 1A and 1B can be obtained.

As means for forming the recess portion 3 to the ceramic plate 2, for example, blasting and etching can be used. Preferably, the recess portion 3 is manufactured by performing grinding with a rotary processing machine. With the rotary processing machine being used, the outer peripheral portion 4 and the recess portion 3 can be processed at the same time by continuously performing a series of processes from a roughly processed state where a polishing margin remains to finishing. In addition, the outer peripheral portion 4 and the recess portion 3 can thereby be finished with high precision.

When finishing the recess portion 3, a finishing margin of the outer peripheral portion 4 is remained unprocessed, and only the outer peripheral portion 4 can be processed by lap-polishing finishing. As conditions for the lap polishing, in a case where the ceramic plate 2 is formed of an aluminum-nitride-based sinter, the top face of the outer peripheral portion 4 can be formed to exhibit a waviness of 1 to 3 µm by using a cast-iron lapping bed having a flatness of 10 µm or less and diamond abrasive grains of 10 µm or less.

Figure 4:
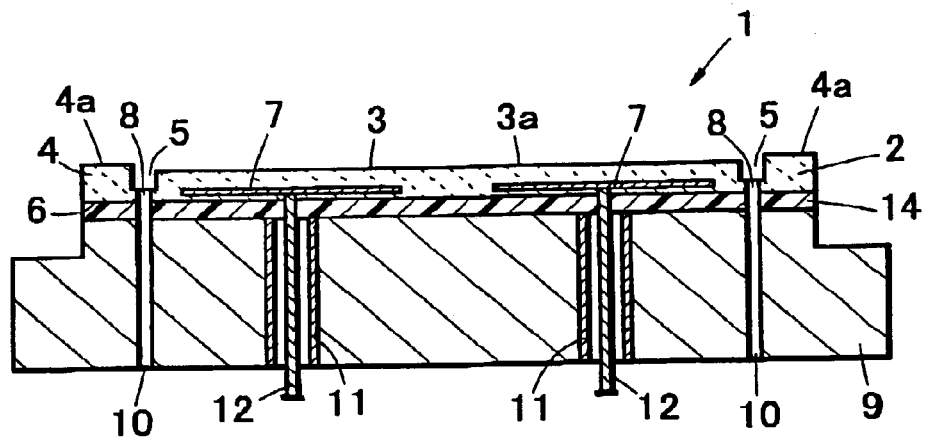
FIG. 4 is a cross-sectional view of an electrostatic chuck according to another embodiment of the present invention.

FIG. 4 shows an electrostatic chuck 1 according to another embodiment which includes an electrostatic attraction electrode 7 embedded in a ceramic plate 2 in a lower portion of a recess-portion bottom surface. The structure described above can also be used for the ceramic plate 2 of this type.

The present invention is not limited to the present embodiments described above, and it should be apparent that improvements, modifications and the like can be implemented without departing from the scope of the invention.

FIRST EXAMPLE

Electrostatic chucks 1 shown in FIG. 1 were manufactured and experiments were carried out to investigate the temperature variation, the amount of leakage of a heat-conductive gas, and the dechucking sensitivity in the surface of the wafer by providing recess portions having different depths h.

In the experiments, fox each of the electrostatic chucks 1, a disc-shaped ceramic plates 2 was prepared of a sinter of aluminum nitride with a diameter of 200 mm and a thickness of 1 mm. A nickel film for an electrostatic electrode 7 was applied on the other main surface of the ceramic plate 2 by a plating technique, subsequently, unnecessary portions were etched to remove, and electrostatic attraction electrodes 7 composed of a pair of semicircular nickel films was prepared to be of a circular shape.

Power feeders 12 were adhered to each electrostatic attraction electrodes 7 via a conductive adhesive, and thereafter an aluminum base member 9 was adhered to the other main surface of the ceramic plate 2 using an insulating adhesive layer 14 of a silicone based adhesive.

Thereafter, a gas groove 5 and gas-introducing holes 8 communicating with the gas groove 5 were formed by blasting in predetermined positions of the one main surface of the ceramic plate 2. Thereafter, a recess portion 3 having a different depth h was formed on a portion except for an outer peripheral portion 4 of the one main surface of the ceramic plate 2. In this manner, each of the electrostatic chucks 1 was manufactured for use as a test sample.

In each of the electrostatic chucks 1, the width t of the top face of the outer peripheral portion 4 is 4 mm, the diameter of the recess-portion bottom surface surrounded by the gas groove 5 is 190 mm, and the distance k from the outermost peripheral portion of the occupational region of the electrostatic attraction electrode 7 to the inner wall surface of the outer peripheral portion 4 is 5 mm.

The electrostatic chuck 1 thus manufactured was set into a vacuum chamber and then, as shown in FIG. 3A, an 8-inch silicon wafer was mounted over the top face of the outer peripheral portion 4, and a voltage was applied to the pair of electrostatic attraction electrodes 7 to generate an electrostatic force. Subsequently, a helium gas was supplied as a heat-conductive gas from the gas-introducing holes 8 at a pressure of 2,666 Pa in a state where the silicon wafer is attracted to the electrostatic chuck 1, as shown in FIG. 3B. In this state, a leakage of helium was measured with respect to the supply of the helium and a difference in pressure in the vacuum chamber. The temperature variations on the surface of the silicon wafer at that time were measured wherein wafer surface temperatures were set to 100° C. The temperature variations were measured by way of temperature differences $\Delta T$ between a maximum and a minimum of temperatures determined at arbitrarily selected 10 measurement points on the wafer surface.

In the electrical conduction to the electrostatic attraction electrodes 7 was discontinued after 60 seconds of supply of the helium gas. In this state, a time until dechucking of the wafer was determined as a dechucking sensitive time, with the dechucking sensitivity evaluated. However, the amount of helium leakage starts to sharply increase quickly after the wafer is dechucked. For this reason, the time in which the amount of helium gas leakage sharply increases after the electrical conduction to the electrostatic attraction electrodes 7 is discontinued to 10 SCCM was measured and evaluated for the time until the wafer is dechucked. The individual measurement results are shown in Table 1.

TABLE 1

| NO. | DEPTH (μm) | WAVINESS (μm) | DISTANCE (mm) | HELIUM LEAKAGE AMOUNT (SCCM) | WAFER TEMPEPATURE VARIATIONS ΔT(° C.) | DECHUCKING SENSITIVE TIME (sec) |
|---|---|---|---|---|---|---|
| 1 | 0  | 1 | 5 | 8.3 | 12.0 | 5.3 |
| 2 | 3  | 1 | 5 | 3.4 | 4.6  | 8.7 |
| 3 | 5  | 1 | 5 | 2.8 | 4.8  | 7.6 |
| 4 | 10 | 1 | 5 | 3.5 | 4.8  | 7.3 |
| 5 | 15 | 1 | 5 | 7.8 | 6.9  | 6.5 |

Table 1 discloses that any one of the test samples exhibited good dechucking sensitivity; specifically, the wafer-dechucking time was within 10 seconds with any one of the test samples. Regarding the helium gas leakage, Table 1 shows the results as described hereunder. In test sample No. 1 in which the depth h of the recess portion 3 is 0 μm, since no stepped portion is formed between the recess-portion bottom surface and the top face of the outer peripheral portion 4 at the time when the wafer is attracted and fixedly set, the wafer circumferential edge could not firmly be chucked to the top face of the outer peripheral portion 4. This produced a helium gas leakage of as much as 8.3 SCCM.

In test sample No. 5 in which the depth h of the recess portion 3 is 15 μm, since the distance from the wafer to the recess-portion bottom surface is excessively long, a sufficiently great electrostatic force could not be generated even after conducting to the electrostatic attraction electrodes 7 and be attracted strongly. Hence, gaps were developed by the helium-gas supply pressure between the wafer and the top face of the outer peripheral portion 4, thereby producing a helium gas leakage of as much as 7.8 SCCM.

Regarding the wafer-surface temperature variation, Table 1 shows the results as described hereunder. In test sample No. 1 in which the depth h of the recess portion 3 is 0 μm, since the helium gas did not sufficiently reach the center of the wafer because of the leakage of the helium gas, the heat conductivity properties could not sufficiently be enhanced in the center of the wafer. Consequently, the temperature variation of the wafer-surface was as large as 12° C.

In comparison, in each of test sample Nos. 2 to 4 in which the depth h of the recess portion 3 is in a range of from 3 to 10 μm exhibited good results. Specifically, the amount of helium gas leakage could be reduced to 5 SCCM or less, and concurrently the wafer-surface temperature variation could uniformly be reduced to 5° C. or lower.

It can be known from these results that the depth h of the recess portion 3 should be in the range of from 3 to 10 μm to obtain good properties.

SECOND EXAMPLE

Experiments were carried out to investigate the wafer-surface temperature variation, the amount of leakage of the heat-conductive gas, and the dechucking sensitivity. The experiments were carried out in the same conditions as those in the first example except that the depth h of the recess portion 3 was fixed at 5 μm, and the waviness of the top face of the outer peripheral portion 4 was changed. The results are shown in Table 2.

TABLE 2

| NO. | DEPTH (μm) | WAVINESS (μm) | DISTANCE (mm) | HELIUM LEAKAGE AMOUNT (SCCM) | WAFER TEMPERATURE VARIATIONS ΔT(° C.) | DECHUCKING SENSITIVE TIME (sec) |
|---|---|---|---|---|---|---|
| 6 | 5 | 0.5 | 5 | 2.4  | 4.5  | 13.5 |
| 7 | 5 | 1   | 5 | 2.8  | 4.8  | 7.6  |
| 8 | 5 | 3   | 5 | 3.5  | 4.9  | 5.3  |
| 9 | 5 | 5   | 5 | 12.7 | 11.8 | 4.5  |

As can be seen in Table 2, in test sample No. 6 in which the waviness of the top face of the outer peripheral portion 4 is 0.5 μm, the dechucking sensitive time was as long as 13.5 seconds. This is considered to have occurred for the reason that since the waviness of the outer peripheral portion 4 is small, the circumferential edge of the wafer is pressed onto the top face of the outer peripheral portion 4 at the time of attraction; and as a result, the wafer enters a vacuum-tightened wringing state where the wafer cannot easily be dechucked.

In test sample No. 9 in which the waviness of the top face of the outer peripheral portion 4 is 5 μm, since the wafer could not tight-chucked along the waviness at the time of attraction, gaps were developed between the wafer and the top face of the outer peripheral portion 4. These gaps caused a helium gas leakage of as much as 12.7 SCCM.

In comparison to the above, in each of test sample Nos. 7 and 8 in which the waviness of the top face of the outer peripheral portion 4 is in a range of from 1 to 3 μm, the amount of helium gas leakage could be reduced to 5 SCCM or less. Concurrently, the temperature variation on the wafer surface could uniformly be reduced to 5° C. or lower, and high dechucking sensitivity was exhibited.

It can be known from these results that the waviness of the top face of the outer peripheral portion 4 is in a range of from 1 to 3 μm.

Thus, the following can be known from the results of the experiments performed in the first and second examples. The electrostatic chuck 1 is constructed in which the depth h of the recess portion 3 is in the range of from 3 to 10 μm, the waviness of the top face of the outer peripheral portion 4 is in the range of from 1 to 3 μm, and the electrostatic attraction electrodes 7 are disposed on the other main surface 6 of the ceramic plate 2 formed below the recess-portion bottom surface. Thereby, the electrostatic chuck 1 can be provided that is capable of causing the temperature distribution over the wafer surface to be uniform while reducing the leakage of the heat-conductive gas and that is superior in the wafer-dechucking sensitivity. Moreover, in the electrostatic chuck 1, since a great attraction force can be secured, even a wafer including a deformation such as a warped portion can firmly be attracted and fixedly set.

THIRD EXAMPLE

Other experiments were carried out to investigate the wafer-surface temperature variation, the amount of leakage of the heat-conductive gas, and the dechucking sensitivity. The experiments were carried out in the same conditions as those in the first example except that the depth h of the recess portion 3 was fixed at 5 μm, the waviness of the top face of the outer peripheral portion 4 was fixed at 1 μm, and the distance k from the outermost peripheral portion in the occupational region of the electrostatic attraction electrode 1 to the inner wall surface of the outer peripheral portion 4 was changed. The results are shown in Table 3.

is excessively narrow, the wafer-attracting force at the bottom surface of the recess portion is small.

Accordingly, the force for pressing the circumferential edge of the wafer onto the top face of the outer peripheral portion 4 is small. As a result, gaps were partly developed by the pressure of the helium gas between the circumferential edge of the wafer and the top face of the outer peripheral portion 4. The gaps caused a helium gas leakage of as much as 7.7 SCCM.

In comparison to the above, in each of test sample Nos. 11 and 12 in which the distance k from the outermost peripheral portion in the occupational region of the electrostatic attraction electrode 7 to the inner wall surface of the outer peripheral portion 4 is in a range of from 5 to 10 mm, the amount of helium gas leakage was as small as 5 SCCM or less.

In addition, the time taken for the dechucking of the wafer was as short as 10 seconds; that is, a good result was attained. Moreover, a good result was attained for the temperature variation on the wafer-surface; specifically, the variation was as low as 5° C. or lower.

It can be known from these results that the distance k from the outermost peripheral portion in the occupational region of the electrostatic attraction electrode 7 to the inner wall surface of the outer peripheral portion 4 should be in the range of from 5 to 10 mm to obtain good properties.

EMBODIMENT 2

Figure 5:
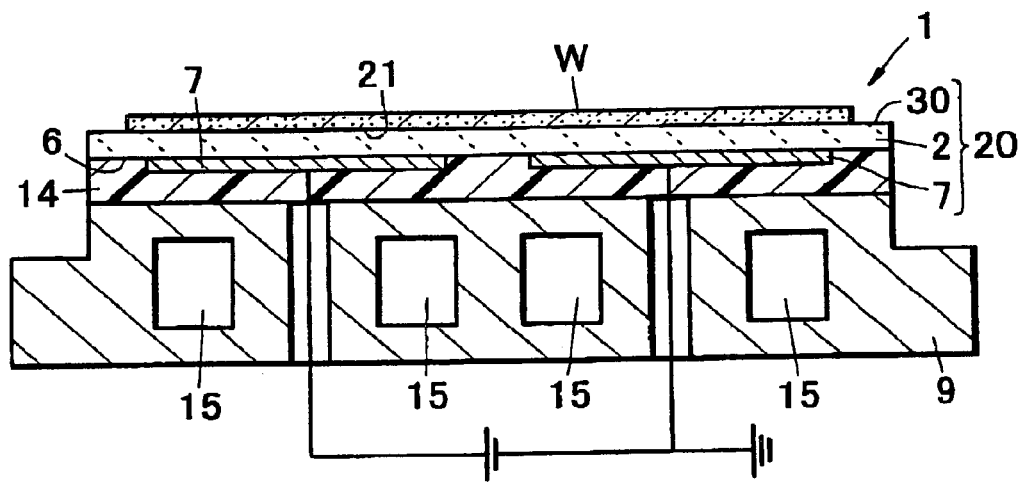
FIG. 5 is a cross-sectional view of an electrostatic chuck according to another embodiment of the present invention.

FIG. 5 is a cross-sectional view showing an example of an electrostatic chuck of the present invention.

The electrostatic chuck 1 is formed such that a wafer-holding member 20 and a base member 9 are adhered together via the adhesive layer 14. In the wafer-holding member 20, one main surface of the disc-shaped ceramic

TABLE 3

| NO. | DEPTH (μm) | WAVINESS (μm) | DISTANCE (mm) | HELIUM LEAKAGE AMOUNT (SCCM) | WAFER TEMPERATURE VARIATIONS ΔT(° C.) | DECHUCKING SENSITIVE TIME (sec) |
|---|---|---|---|---|---|---|
| 10 | 5 | 1 | 3 | 2.1 | 4.3 | 15.3 |
| 11 | 5 | 1 | 5 | 2.8 | 4.8 | 7.6 |
| 12 | 5 | 1 | 10 | 4.3 | 4.9 | 5.5 |
| 13 | 5 | 1 | 15 | 7.7 | 7.9 | 2.1 |

As can be seen in Table 3, in test sample No. 10 in which the distance k from the outermost peripheral portion in the occupational region of the electrostatic attraction electrode 7 to the inner wall surface of the outer peripheral portion 4 is 3 mm, the wafer-dechucking sensitive time was as long as 15.3 seconds.

This is considered to have occurred for the reason that since the electrostatic attraction electrode 7 is formed up to the vicinity of a lower portion of the outer peripheral portion 4, the electrostatic force influences portions including the outer peripheral portion 4, in which a residual attraction force exerts on the outer peripheral portion 4 at the wafer-dechucking time, and the long time is therefore taken for the dechucking.

In test sample No. 13 in which the distance k from the outermost peripheral portion in the occupational region of the electrostatic attraction electrode 7 to the inner wall surface of the outer peripheral portion 4 is 15 mm, since the occupational region of the electrostatic attraction electrode 7 plate 2 is formed as a mounting surface 30 for mounting a wafer W such as a semiconductor wafer, and a pair of electrostatic attraction electrodes 7 are provided on an other main surface 6 of the ceramic plate 2. Fluid paths 15 through which a cooling gas or a cooling water flows are formed in the base member 9.

Figure 6:
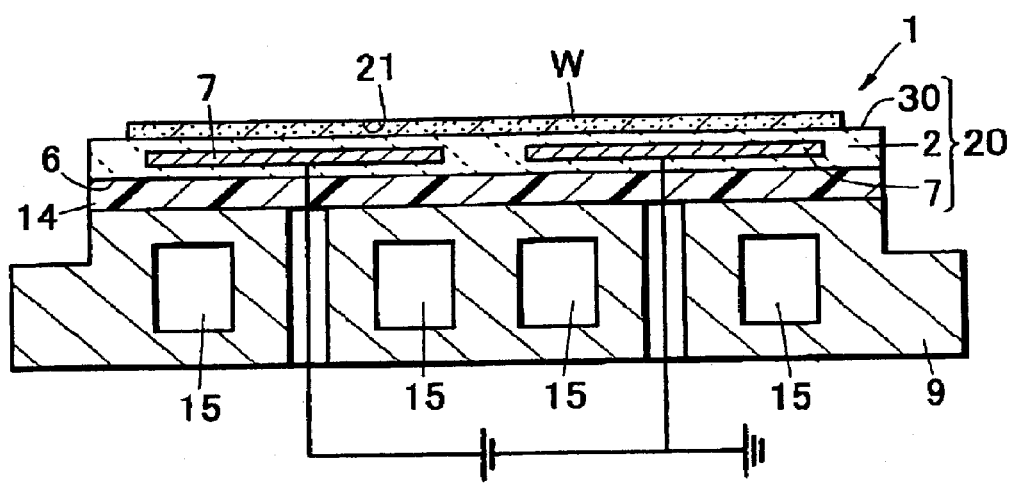
FIG. 6 is a cross-sectional view of an electrostatic chuck according to another embodiment of the present invention.

FIG. 6 is a cross-sectional view showing another example of an electrostatic chuck of the present invention.

The electrostatic chuck 1 is formed such that a wafer-holding member 20 and a base member 9 are adhered together via the adhesive layer 14. In the wafer-holding member 20, one main surface of the disc-shaped ceramics plate 2 is formed as a mounting surface 30 for mounting a wafer W such as a semiconductor wafer, and a pair of electrostatic attraction electrodes 7 are provided in the ceramic plate 2. Fluid paths 18 through which a cooling gas or a cooling water flows are formed in the base member 9.

Either of the electrostatic chucks 1 described above is constructed to satisfy the relation expressed as A<B and concurrently $0.500<(B-A)/B\leq0.998$, where "A" represents an arithmetic mean surface roughness (Ra) as a surface roughness of the mounting surface 30 of the ceramic plate 2 constituting the wafer-holding member 20, and "B" represents an arithmetic mean surface roughness (Ra) as a surface roughness of the other main surface 6 of the ceramic plate 2.

In the construction described above, when the wafer W is mounted on the mounting surface 30 of the electrostatic chuck 1 and a voltage is applied between the pair of electrostatic attraction electrodes 7, an electrostatic force is generated between the wafer W and the mounting surface 30. Thereby, the wafer W can he attracted to the mounting surface 30.

In addition, in a state where, for example, a cooling gas or a cooling water flows, when a manufacturing process such as exposure, deposition, etching, or dicing is performed for the wafer W attractively held to the mounting surface 30, heat exerted on the wafer W during the manufacturing process can be transferred to the base member 9 via the wafer-holding member 20. This enables the temperature of the wafer W to be prevented from being increased higher than a predetermined processing temperature.

With a cooling gas or cooling water flowing through the fluid paths 15 of the base member 9, since wafer-holding member 20 on the side of the base member 9 is cooled, a temperature difference occurs between the side of the base member 9 and the side of the mounting surface 30. In addition, with heat being exerted on the wafer W in a manufacturing process, the temperature on the side of the mounting surface 30 is further increased, thereby causing a significant temperature difference between the sides of the wafer-holding member 20 and the mounting surface 30.

The ceramic plate 2 constituting the wafer-holding member 20 is warped convex toward the side of the mounting surface 30. As described above, however, in the present invention, the other main surface 6 of the ceramic plate 2 is finished rougher than the mounting surface 30, such possible warping of the ceramic plate 2 because of the temperature difference can be restrained. Consequently, the mounting surface 30, is not significantly warped even under the severe conditions including the temperature difference between the side of the mounting surface 30 of the wafer-holding member 20 and the side of the base member 9, and the attracted wafer W can be held with high precision.

Figure 7:
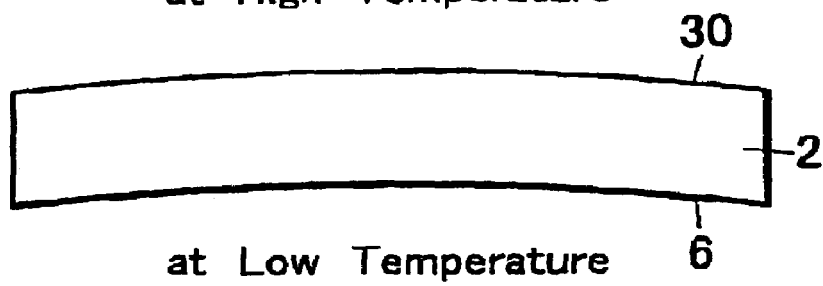
FIGS. 7A to 7C are cross-sectional views each showing a deflection behavior of a ceramic plate associated with a surface condition and a temperature distribution of the ceramic plate used for the electrostatic chuck of the present invention.
Figure 7:
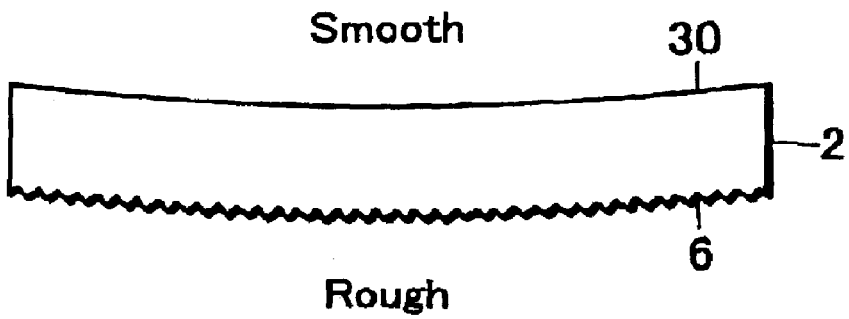
Figure 7:
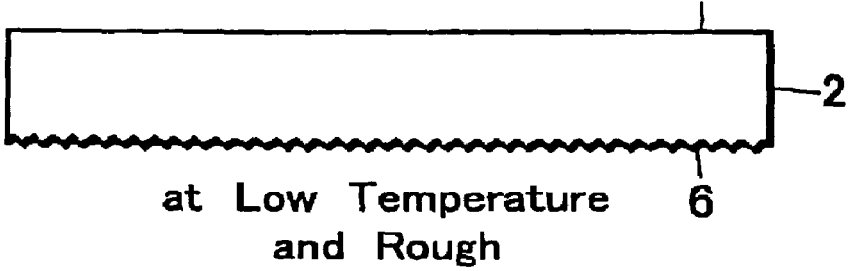

In more specific, since the ceramic plate 2 constituting the wafer-holding member 20 is thin, when a temperature difference occurs between upper and lower surfaces, the surface having a higher temperature is warped convex, as shown in FIG. 7A. However, as shown in FIG. 7B, in the present invention, the other main surface 6 of the ceramic plate 2 is purposely finished to a surface roughness greater than that of the mounting surface 30.

In addition, the residual stress on the side of the other main surface 6 is arranged greater than that of the mounting surface 30 to thereby allow the ceramic plate 2 on the side of the other main surface 6 to be warped convex. Thereby, warpings on the two sides are mutually offset, consequently enabling possible warpage of the mounting surface 30 to be prevented, as shown in FIG. 7C.

Suppose the surface roughness of the other main surface 6 of the ceramic plate 2 is greater than that of the mounting surface 30. In this case, while the ceramic plate 2 on the side of the other main surface 6 is warped convex, since the ceramic plate 2 is adhered to the base member 9 via the adhesive layer 14 at a room temperature, warpage of the ceramic plate 2 is restrained. That is, the mounting surface 30 can be maintained planar even at a room temperature. As such, the processing precision can be enhanced by performing a process such as exposure, deposition, etching, or dicing for the wafer W.

To obtain the advantages described above, it is preferable that the construction satisfy the relation expressed as A<B and concurrently $0.500<(B-A)/B\leq0.998$, where "A" represents, a surface roughness, in arithtmetic mean surface roughness (Ra), of the mounting surface 30 of the ceramic plate 2, and "B" represents a surface roughness, in arithmetic mean surface roughness (Ra), of the other main surface G of the ceramic plate 2. The reasons for the above are described hereunder. Suppose the surface roughness of the mounting surface 30 of the ceramic plate 2 and the other main surface 6 thereof are related as $A\geq B$.

In this case, the side of the mounting surface 30 of the ceramic plate 2 tends to be warped convex. In addition, when the temperature on the side of the mounting surface 30 is relatively high and the temperature on the side of the other main surface 6 is relatively low, the side of the mounting surface 30 is further warped and cannot therefore be maintained planar.

Even in the case of A<B, when the value of (B−A)/B is larger than 0.998, since the stress is exerted on the thin ceramic plate 2, it is difficult to maintain the mounting surface 30 to be planar while attempting the adhesion of the ceramic plate 2 to the base member 9. In a severe case, the thin ceramic plate 2 is likely damaged. In contrast, even in the case of A<B, when the value of (B−A)/B is 0.500 or less, since the stress is exerted on the thin ceramic plate 2, the force for causing the ceramic plate 2 on the side of the other main surface 6 to be warped convex is small.

Since the temperature on the side of the mounting surface 30 is high at a manufacturing process, even when the temperature on the side of the other main surface 6 is decreased, warpage of the mounting surface 30 cannot sufficiently he restrained.

It is more preferable that the construction be capable of satisfying the relation expressed as A<B and concurrently $60.0<(B-A)/B\leq80.0$. The construction arranged to the range of the expression is enabled to further reduce warpage of the mounting surface 30 at the time of a manufacturing process.

The arithmetic mean surface roughness (Ra) of each of the mounting surface 30 and the other main surface 6 was measured in accordance with JIS B0601. For the present invention, three or more portions of each of the mounting surface 30 and the other main surface 6 were measured, and a mean value was used as the arithmetic mean surface roughness (Ra).

Even in a case satisfying the relation described above, when the surface roughness is excessively large, gaps are developed between the water W and the mounting surface 30. Thereby, the attraction force is reduced, so that the wafer W cannot be held at high precision because of the surface roughness of the mounting surface 30.

Accordingly, the mounting surface 30 is preferably finished to an arithmetic mean surface roughness (Ra) of 1.5 μm or less, and more preferably to 1.0 μm or less as the surface roughness thereof.

However, in a case where the arithmetic mean roughness (Ra) of the mounting surface 30 is less than 0.01 μm, even after discontinuation of electrical conduction to the electrostatic attraction electrode 7, the wafer W is still remained tightly chucked to the mounting surface 30, therefore requiring a prolonged dechucking time of the wafer W. To prevent these problems, the mounting surface 30 is preferably finished to an arithmetic mean surface roughness (Ra) in a range of from 0.01 to 1.5 µm.

The surface roughness of the other main surface 6 of the ceramic plate 2 is not specifically limited. However, as in the electrostatic chuck 1 shown in FIG. 6, in a case where the electrostatic attraction electrodes 7 are formed onto the other main surface 6, when the surface roughness of the other main surface 6 is excessively great, since a conductive film for forming the electrostatic attraction electrodes 7 cannot sufficiently be formed to reach the recess portion of the other main surface 6.

Hence, the adhesion is not strong enough, and the electrostatic attraction electrodes 7 are prone to separation. To prevent such a problem, when forming the electrostatic attraction electrodes 7 to the other main surface 6 of the ceramic plate 2, the other main surface 6 is preliminarily finished to an arithmetic mean surface roughness (Ra) of 5.0 µm of less.

Figure 8:
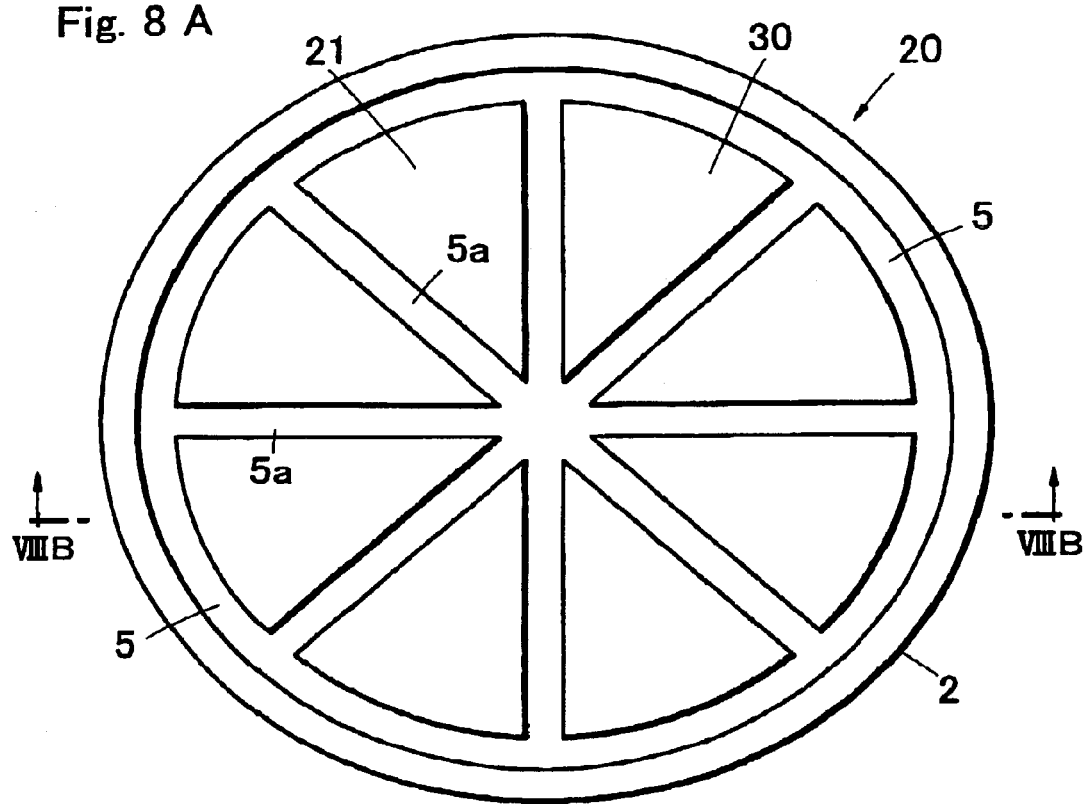
FIG. 8A is a top view of a ceramic plate used for the electrostatic chuck according to the embodiment of the present invention.
FIG. 8B is a cross-sectional view of the ceramic plate taken along the line 8B—8B of FIG. 8A.
Figure 8:
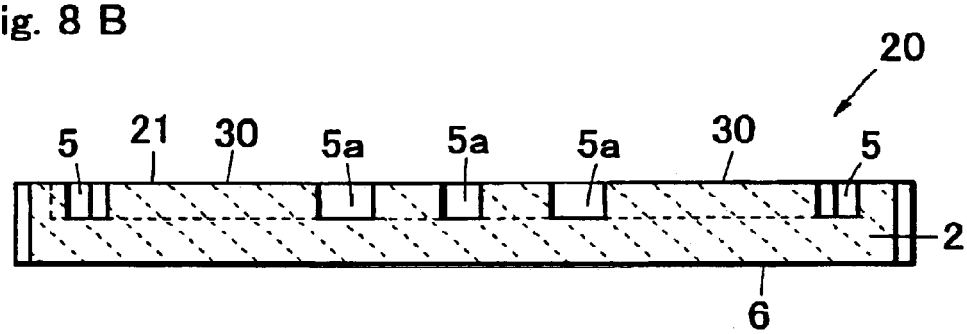

FIGS. 8A and 8B show views relative to a mounting surface according to another embodiment. As shown in the drawings, the structure may be such that one main surface of a ceramic plate 2 is formed as a mounting surface 30, and gas grooves 5 and 5a that are used to supply a helium gas or the like are provided to the mounting surface 30.

Figure 9:
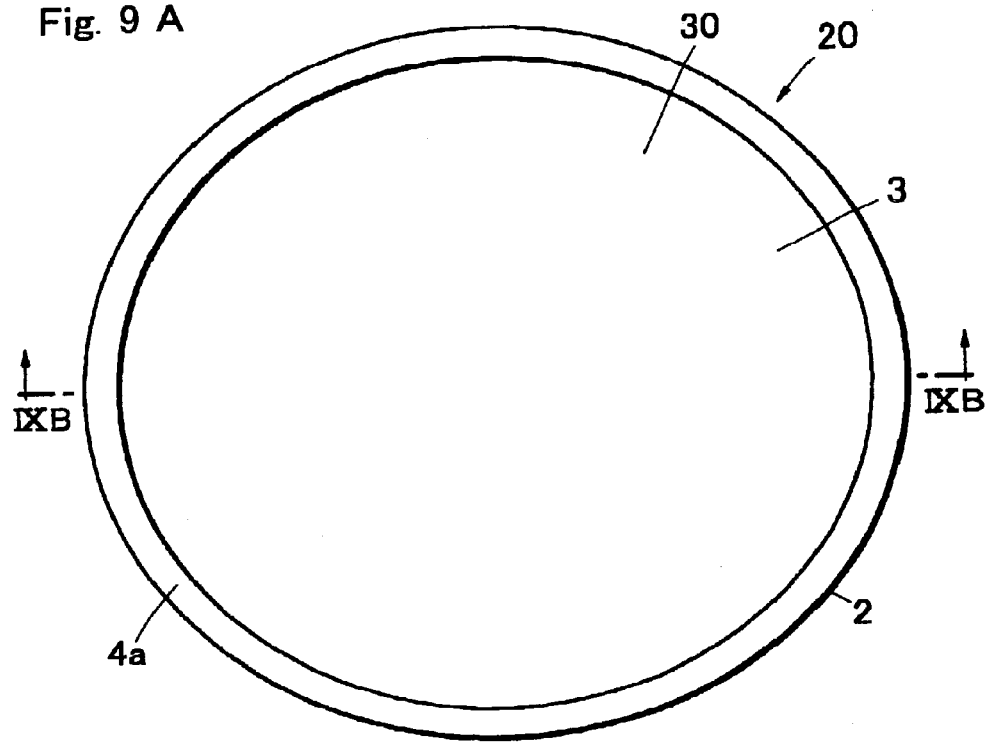
FIG. 9A is a top view of a ceramic plate used for the electrostatic chuck according to the embodiment of the present invention.
FIG. 9B is a cross-sectional view of the ceramic plate taken along the line 9B—9B of FIG. 9A.
Figure 9:
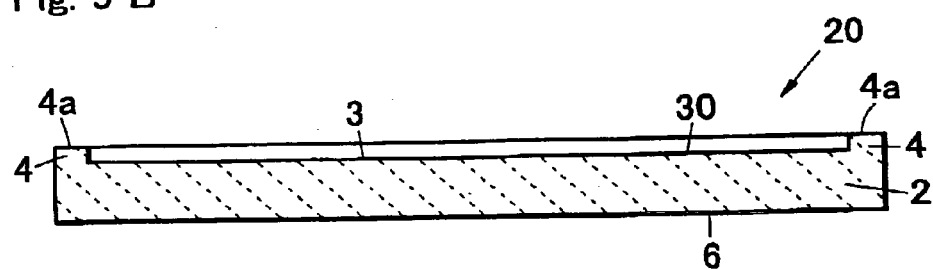

FIGS. 9A and 9B show still another embodiment As shown in the drawings, the structure may be such that a convex portion 3 is formed on one main surface of a ceramic plate 2, and the bottom surface of the recess portion 3 is formed as a mounting surface 30.

Figure 10:
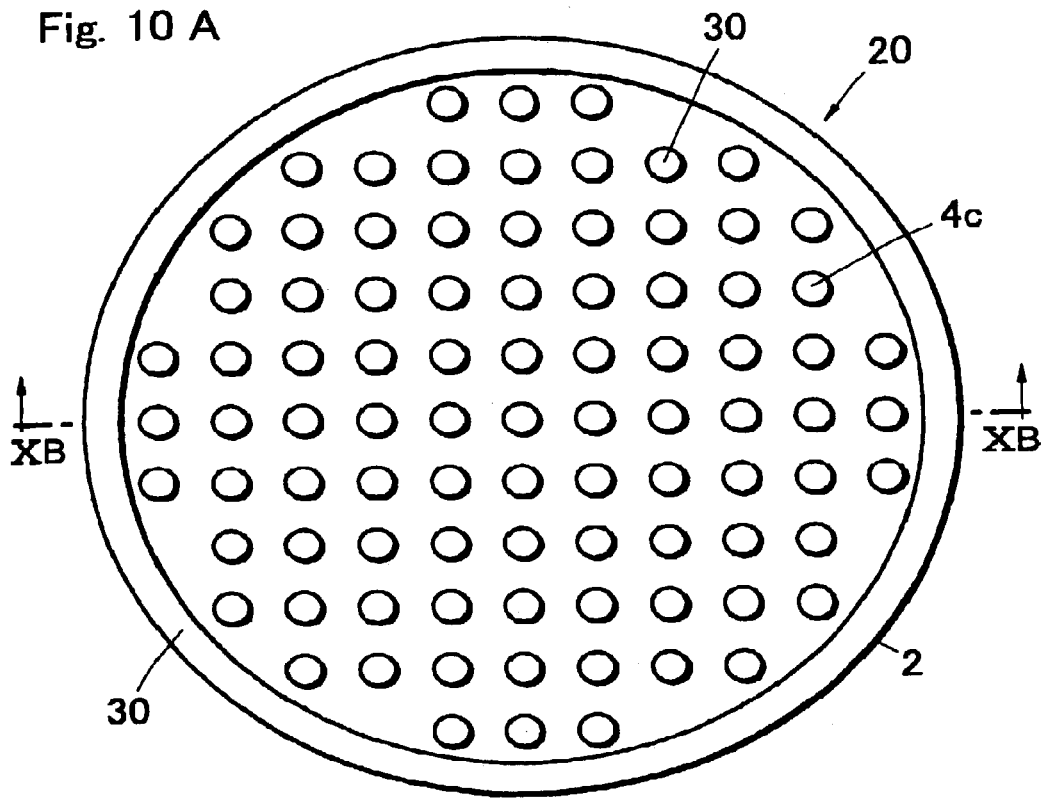
FIG. 10A is a top view of a ceramic plate used for the electrostatic chuck according to the present invention.
FIG. 10B is a cross-sectional view of the ceramic plate taken along the line 10B—10B of FIG. 10A.
Figure 10:
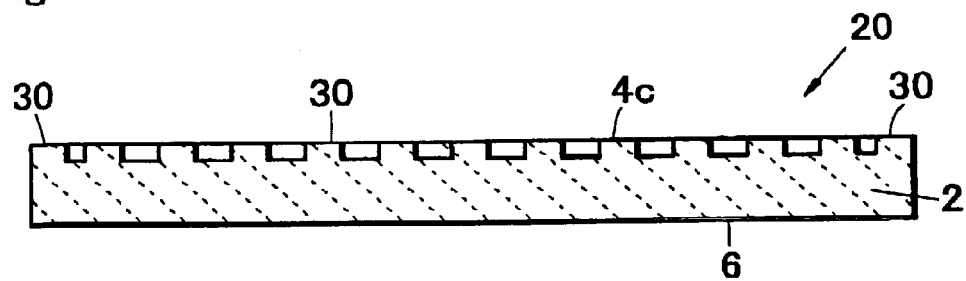
Figure 11:
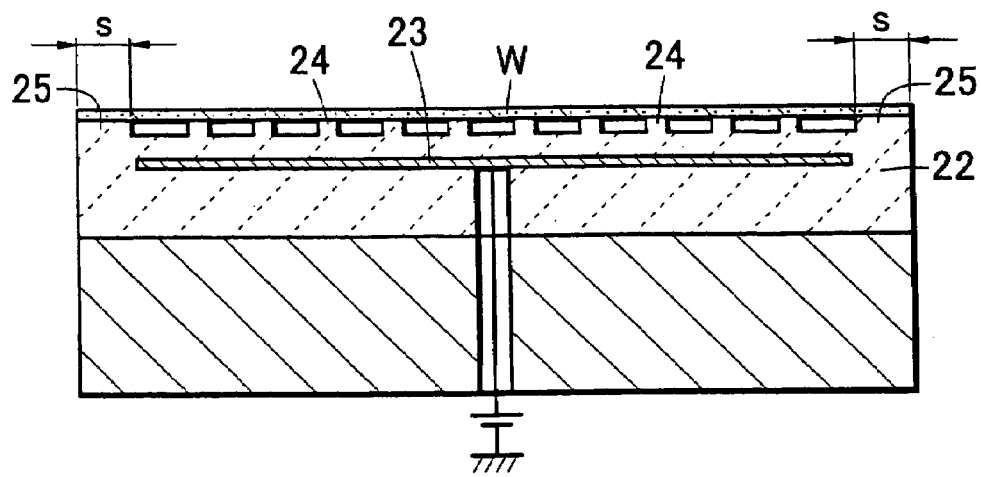
FIG. 11 is a cross-sectional view showing an example of a conventional electrostatic chuck.
Figure 12:
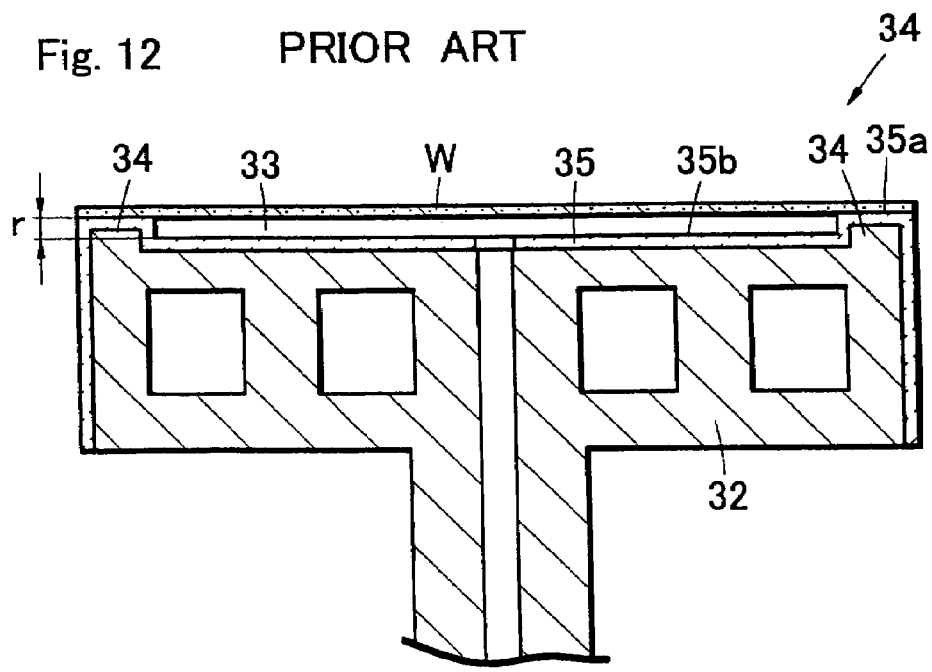
FIG. 12 is a cross-sectional view showing another example of a conventional electrostatic chuck.
Figure 13:
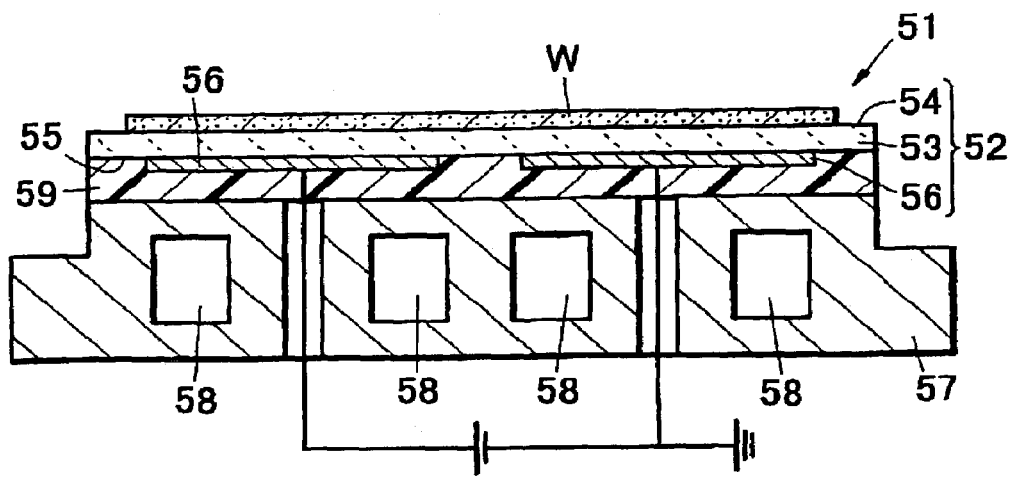
FIG. 13 is a cross-sectional view showing another example of a conventional electrostatic chuck.
Figure 14:
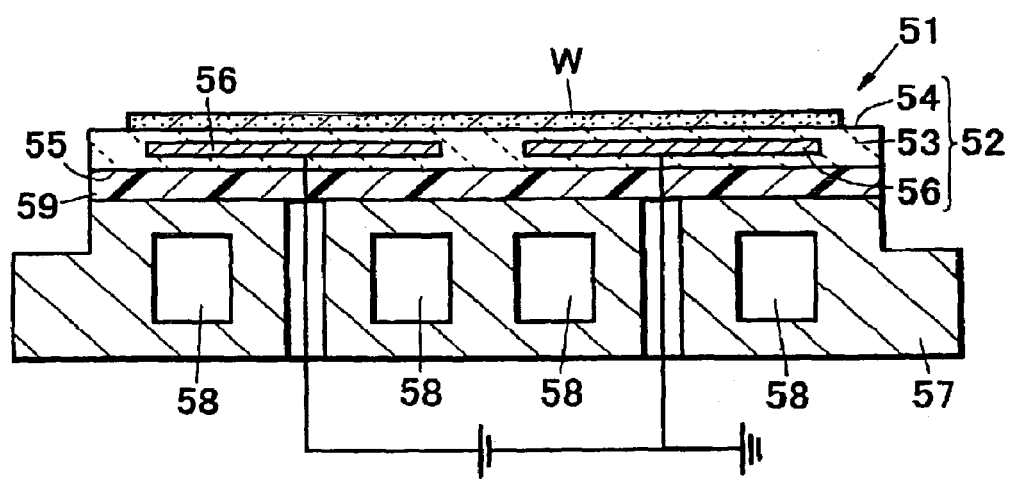
FIG. 14 is a cross-sectional view showing another example of a conventional electrostatic chuck.

FIGS. 10A and 10B show still another embodiment. As shown in the drawings, the structure may be such that many protrusions 4c are provided on one main surface of a ceramic plate 2, and top faces of the protrusions 4c are formed as a mounting surface 30.

In a case where each of the structures of the mounting surfaces, a value (A) of the arithmetic mean surface( roughness (Ra) of the one main surface of the ceramic plate 2 and a value (B) of the arithmetic mean surface roughness (Ra) of the other main surface 6 thereof satisfy the relation expressed by A<B and concurrently $0.500<(B-A)/B\leq0.998$.

In this case, the roughness of the one main surface of the ceramic plate 2 corresponds to the surface roughness of the mounting surface 30 excluding the gas grooves 5 and 5a illustrated in FIGS. 8A and 8B, to the surface roughness of the recess-portion bottom surface formed as the mounting surface 30 illustrated in FIGS. 9A and 9B, and to the surface roughness of the one main surface excluding the protrusions 4c of the ceramic plate 2 illustrated in FIGS. 10A and 10B.

The ceramic plate 2 constituting the wafer-holding member 20 includes a ceramic sinter having a rigidity of 200 GPa or higher, such as a ceramic with a main component such as alumina, aluminum nitride, silicon nitride, silicon carbide, titanate barium, titanate calcium, or yttrium, or single crystalline alumina.

Particularly, since an aluminum-nitride-based sinter has a high corrosion resistance and an anti-plasma property, it is suitable for use in a case where the ceramic plate 2 is exposed to a halogen-based gas that is used for, for example, etching or cleaning.

For the electrostatic attraction electrodes 7 formed on the surface of the ceramic plate 2 or in the ceramic plate 2, metal such as titanium, nickel, tungsten, or molybdenum having a small thermal expansion difference with a ceramic sinter or single crystalline alumina which is formed the ceramic plate 2 may be used. The electrostatic attraction electrode 7 may be in the form of any one of a metal film, metal foil, and metal mesh.

In the manufacture of each of the electrostatic chucks shown in FIGS. 5 and 6, first, a wafer-holding member is formed. For the wafer-holding member shown in FIG. 5, a sintered ceramic plate 2 is prepared, arid polishing, lapping, or blasting is performed to adjust the upper and lower surfaces to substantially the same roughness. In this case, the surface roughness of each of the upper and lower surfaces is preferably adjusted to an arithmetic mean surface roughness (Ra) of 2 to 5 µm.

Subsequently, a metal film is formed by film-forming means, such as sputtering or plating, on substantially the overall surface of the other main surface 6 of the ceramic plate 2. Then, unnecessary portions of the metal film are removed by blasting or etching and forming the predetermined patterns, thereby the electrostatic attraction electrodes 7 are formed. In an alternative method, the wafer-holding member 20 is formed such that electrostatic attraction electrodes 7 formed of a metal foil or a metal mesh is adhered to the other main surface 6 of the ceramic plate 2.

When forming the wafer-holding member 20 shown in FIG. 6, a plurality of un-sintered ceramic green sheets are prepared, some of the sheets are laminated, and metal paste is then printed. In an alternative method, electrostatic attraction electrodes 7 each formed by making metal paste to a sheet state are placed, remaining ceramic green sheets are overlapped and laminated, and sintering is then performed; and thereby, the ceramic plate 2 in which the electrostatic attraction electrodes 7 are embedded is formed. Further, the wafer-holding member 20 is manufactured in a manner that polishing, lapping, or blasting is performed for the ceramic plate 2, and the surface roughness of the upper and lower surfaces thereof are thereby be adjusted to substantially be same. Alternatively, the wafer-holding member 20 is manufactured in the following manner.

The ceramic plate 2 in which the electrostatic attraction electrodes 7 are embedded is formed in such a manner that an un-sintered ceramic body is formed using a metal mold, and metal paste is then printed; or alternatively, electrostatic attraction electrodes 7 formed of a metal foil or a metal mesh are placed, ceramic powder is filled, and they are integrally sintered.

In addition, polishing, lapping, or blasting is performed for the ceramic plate 2 to adjust the upper and lower surfaces thereof to substantially the same roughness. In this case, the surface roughness of each of the upper and lower surfaces is preferably adjusted to an arithmetic mean surface roughness (Ra) of 2 to 5 µm.

Subsequently, a base member 9 is prepared. The base member 9 is formed of aluminum, copper, an aluminum alloy, a copper alloy, or a composite material formed by filling aluminum into openings of a porous ceramic body. In addition, the base member 9 is formed to include fluid paths 15. Then, an adhesive is applied on an adhesion surface of the base member 9.

Thereafter, the other main surface 6 of the wafer-holding member 20 shown in each of FIGS. 5 and 6 is adhered to the adhesion surface, and the adhesive is then cured.

In this case, since the surface roughnesses of the upper and lower surfaces of the ceramic plate 2 constituting the wafer-holding member 20 shown in each of FIGS. 5 and 6 are adjusted to substantially be the same, warpage of the ceramic plate 2 is small. Consequently, the upper surface of the ceramic plate 2 after adhesion to the base member 9 can be made to be a flat surface with a small warpage.

Subsequently, for example, polishing or lapping is performed for the upper surface of the ceramic plate 2 to finish it to be further smooth, and the mounting surface 30 are thereby formed. In this manner, the electrostatic chuck 1 according to the present invention are manufactured. In this case, the arrangement is made to satisfy a relation expressed as A<B and concurrently 0.500<(B−A)/B≦0.998, where "A" represents the arithmetic mean surface roughness (Ra) as a surface roughness Of the mounting surface 30, and "B" represents an arithmetic mean surface roughness (Ra) as a surface roughness of the main surface on the opposite side of the mounting surface 30. Concurrently, the electrostatic chuck 1 is preferably manufactured so that the arithmetic mean surface roughness (Ra) of the mounting surface 30 is 1.5 μm or less.

When the surface roughnesses of the upper and lower surfaces of the ceramic plate 2 are mutually different as described above, warpage occurs inherently. In the present invention, after the ceramic plate 2 of which the upper and lower surfaces are finished to substantially the same surface roughness is adhered to the base member 9, polishing is performed only for the upper surface of the ceramic plate 2 to mutually differentiate the surface roughnesses of the upper and lower surfaces. Consequently, the ceramic plate 2 can be prevented by the adhesive layer 14 from being warped, thereby enabling the electrostatic chuck 1 including the flat mounting surface 30 to be manufactured.

While the embodiments of the present invention have been disclosed, it is needless to say that the present invention is not limited to these embodiments, and improvements, modifications and the like may be implemented without departing from the scope of the invention.

FOURTH EXAMPLE

Electrostatic chucks 1 shown in FIG. 5 were manufactured by differentiating surface roughness of mounting surfaces 30 of wafer-holding members 20 and main surfaces 6 on opposite sides of the individual mounting surfaces 30. Then, using each of the electrostatic chucks 1, experiments were performed to investigate the amount of a warpage of the mounting surface 30 at the time of a room temperature and the using time(the surface temperature on the side opposing the mounting surface is set lower than the temperature on the side of the mounting surface).

For each of the electrostatic chucks 1 used in the experiments, all the components having same dimensions were used, except for the differentiated surface roughness of the mounting surface 30 of the wafer-holding members 20 and the main surface 6 on the opposite side of the mounting surface 30.

In specific, a disc-shaped aluminum nitride sinter having a diameter of 300 mm and a thickness of 1 mm was used for the ceramic plate 2 constituting the wafer-holding member 20. Then, for example, grinding and blasting were performed to process the upper and lower surfaces of the ceramic plate 2 to substantially the same surface roughness. Thereafter, a Ni film was formed by using a plating technique on substantially the overall surface of the other main surface 6 of the ceramic plate 2. Then, unnecessary portions of the metal film were removed by etching, and a pair of semicircular electrostatic attraction electrodes 7 were thereby formed. In this manner, the wafer-holding member 20 was formed.

Subsequently, an insulating layer formed of a polyimide resin was adhered to the wafer-holding member 20 on the side of the electrostatic attraction electrodes 7, a silicon-based adhesive was applied thereto, and thereafter, an aluminum base member 9 having a diameter of 300 mm and a thickness of 36 mm was adhered thereto. Then, heat was applied to cure the adhesive, and polishing was performed for the mounting surface 30 of the wafer-holding member 20 to differentiate the surface roughness thereof from the surface roughness of the main surface 6 on the opposite side of the mounting surface 30. In this manner, the electrostatic chucks were manufactured for use as test samples.

The surface roughness of each of the mounting surface 30 of the wafer-holding member 20 and the main surface 6 semiconductor were measured at three portions by using a surface-roughness measuring Instrument, and a moan value of arithmetic mean surface roughnesses (Ra) obtained in accordance with JIS B0601 were used as surface roughnesses of the individual surfaces.

First, the amount of a warpage of the mounting surface 30 of each of the electrostatic chucks 1, which was obtained as described above, was measured at a room temperature by using a flatness measuring instrument. Thereafter, the side of the mounting surface 30 was heated using halogen lamps.

Concurrently, the surface temperature of the mounting surface 30 was adjusted to 80° C. by supplying a cooling gas flow into the fluid paths 15 of the base member 9, and the amount of the warpage of the mounting surface 30 at the aforementioned temperature-adjustment time (using time) was measured.

Among the test samples, the one in which the amount of the warpage of the mounting surface 30 at the time of a room temperature and the using time was 10 μm or less was evaluated as a superior one. The results were as shown in Table 4.

TABLE 4

| NO. | ROUGHNESS (A) OF MOUNTING SURFACE (μm) | ROUGHNESS (B) ON OPPOSITE SIDE (μm) | (B−A)/B (−) | AMOUNT OF WARPAGE AT ROOM TEMPERATURE (μm) | AMOUNT OF WARPAGE AT 80° C. (μm) |
|---|---|---|---|---|---|
| 1 | 0.81 | 0.83 | 2.41 | 6.5 | 15.3 |
| 2 | 0.83 | 0.98 | 15.31 | 7.5 | 12.5 |
| 3 | 0.80 | 1.15 | 30.43 | 6.3 | 12.2 |
| 4 | 0.81 | 1.63 | 50.31 | 7.2 | 8.1 |
| 5 | 1.02 | 2.07 | 50.72 | 7.9 | 8.7 |
| 6 | 0.80 | 2 | 60.00 | 6.3 | 6.3 |
| 7 | 0.81 | 3.25 | 75.08 | 5.7 | 5.9 |
| 0 | 0.13 | 0.67 | 80.60 | 4.2 | 4.5 |
| 9 | 0.50 | 2.5 | 80.00 | 5.6 | 6.2 |
| 10 | 0.01 | 4.96 | 99.80 | 3.9 | 8.7 |
| 11 | 0.01 | 6.35 | 99.84 | 4.5 | CRACKED |

TABLE 4-continued

| NO. | ROUGHNESS (A) OF MOUNTING SURFACE (μm) | ROUGHNESS (B) ON OPPOSITE SIDE (μm) | (B-A)/B (-) | AMOUNT OF WARPAGE AT ROOM TEMPERATURE (μm) | AMOUNT OF WARPAGE AT 80° C. (μm) |
|---|---|---|---|---|---|
| 12 | 0.78 | 0.38 | -105.26 | 7.5 | 17.3 |
| 13 | 0.80 | 0.32 | -150.00 | 8.2 | 19.4 |

As a result, at the room temperature, the amount of the warpage of the mounting surface 30 of each of the electrostatic chucks 1 was 10 μm or less.

For each of test samples Nos. 4 to 10, the result was within the range of 0.500<(B-A)/B≦0.998, and the amount of the warpage of the mounting surface 30 could be restrained 10 μm or less. This is considered ascribable to that, while a force is generated according to a temperature difference at the using time and is exerted on the ceramic plate 2 to cause the side of the mounting surface 30 to be convex, since the surface roughnesses of the upper and lower surfaces of the ceramic plate 2 are differentiated so as to exert a force on the ceramic plate 2 to cause the main surface 6 on the opposite side of the mounting surface 30 to be convex, the forces on the two sides are mutually offset.

In test sample No. 1, in which since the difference between the surface roughnesses of the mounting surface 30 of the ceramic plate 2 and the other main surface 6 thereof is little, the temperature difference at the using time caused the ceramic plate 2 to be warped convex toward the side of the mounting surface 30. Consequently, the amount of the warpage was as large as 15.3 μm.

In each of test sample Nos. 12 and 13, in which the surface roughness of the mounting surface 30 is greater than that of the other main surface 6, the surface roughness caused the ceramic plate 2 to be warped convex toward the side of the mounting surface 30. In addition, the temperature difference at the using time caused the warpage to be greater, thus exhibiting an inferior result with a large amount of the warpage of 17.3 μm or greater.

In each of test sample Nos. 2 and 3, since the surface roughnesses were provided such that the value of (B-A)/B is 0.500 or less, it exhibited an inferior result; specifically, the amount of the warpage of the mounting surface 30 due to the temperature difference at the using time was 12.2 μm or greater.

Similar to the above, in test sample No. 11, since the value of (B-A)/B exceeds 0.998, a crack was caused by an internal stress occurred in the ceramic plate 2 at the time of influence of the temperature difference.

FIFTH EXAMPLE

In order to verity preferable surface roughnesses of the mounting surface 30, electrostatic chucks 1 in which the surface roughness (A) of the mounting surface 30 of the ceramic plate 2 and tie surface roughness (B) of the other main surface 6 thereof satisfy the relation expressed as A<B and concurrently 0.500<(B-A)/B≦0.998 were manufactured. Concurrently, gas supply holes opening on the mounting surface 30 were provided, a gas was supplied between a wafer W and the mounting surface 30 from the gas supplyholes in a state where the wafer W is attracted and fixedly set onto the mounting surface 30, and the amount of leakage of the gas was measured. Thereby, experiments were performed to investigate the attraction force.

In the experiments, each of the electrostatic chucks 1 was manufactured to the same dimensions as those of the electrostatic chuck 1 shown in the fourth embodiment. Concurrently, a voltage of 0.500 V was applied to the electrostatic attraction electrodes 7 to attract the wafer W to the mounting surface 30, and a helium gas was introduced at a pressure of 2.7 kPa from the gas-introducing hole. In these conditions, the amounts of gas leakage were measured. The results were as shown in Table 5.

TABLE 5

| NO. | ROUGHNESS (A) OF MOUNTING SURFACE (μm) | ROUGHNESS (B) OPPOSITE SIDE (μm) | (B-A)/B (%) | AMOUNT OF WARPAGE AT ROOM TEMPERATURE (μm) | AMOUNT OF WARPAGE HEATED AT 80° C. (μm) | HELIUM LEAKAGE AMOUNT (SCCM) |
|---|---|---|---|---|---|---|
| 14 | 0.81 | 1.63 | 50.31 | 7.2 | 8.1 | 1.2 |
| 15 | 1.02 | 2.11 | 51.66 | 6.8 | 9.7 | 1.7 |
| 16 | 1.50 | 3.03 | 50.50 | 7.5 | 9.8 | 2.8 |
| 17 | 1.70 | 3.45 | 50.72 | 7.3 | 10.0 | 7.7 |

As a result, as can be seen in Table 5, when the surface roughness of the mounting surface 30 exceeds an arithmetic mean surface roughness (Ra) of 1.5 μm, the amount of the helium gas leakage is increased. This occurs for the reason that, when the surface roughness of the mounting surface 30 of the ceramic plate 2 exceeds 1.5 μm, since the attraction force for the wafer W is reduced, gaps are developed between the wafer W and the mounting surface 30 according to the pressure of the supplied gas, and the helium gas leaks from the gaps.

From these results, it can be known that the mounting surface 30 of the ceramic plate 2 is prepared to an arithmetic mean surface roughness (Ra) of 1.5 μm or less so as not to reduce the attraction force widely.

What is claimed is:

1. An electrostatic chuck for holding a wafer, comprising a ceramic plate having one main surface which is a mounting surface for mounting the wafer; and an electrostatic attraction electrode formed on the other main surface of the ceramic plate or embedded within the ceramic plate, wherein:

the mounting surface of the ceramic plate comprises a recess portion and an outer peripheral portion surrounding the recess portion, the recess portion having a depth in a range of from 3 to 10 μm with respect to the outer peripheral portion, and a gas groove in a peripheral portion of the recess portion; and a top face of the outer peripheral portion comprises waviness having a wave height in a range of from 1 to 3 μm.

2. The electrostatic chuck according to claim 1, wherein a distance from an outermost periphery of the occupational region of the electrostatic attraction electrode to an inner wall of the outer peripheral portion is in a range of from 5 to 10 mm.

3. An electrostatic chuck for holding a wafer, comprising:

a ceramic plate having one main surface which is a mounting surface for mounting the wafer, wherein the mounting surface comprises an outer peripheral portion, wherein a top face of the outer peripheral portion comprises waviness having a wave height in a range of from 1 to 3 μm;

an electrostatic attraction electrode formed on the other main surface or embedded in the ceramic; and a base member that comprises a cooling function and that is adhered to the other main surface of the ceramic plate, wherein a surface roughness A of the mounting surface of the ceramic plate and a surface roughness (Ra) B of the other main surface of the ceramic plate satisfy a relation represented in arithmetic mean surface roughness Ra as A<B, and concurrently $0.500 < (B-A)/B \leq 0.998$.

4. The electrostatic chuck according to claim 3, wherein the surface roughness A of the mounting surface is 1.5 μm or less in arithmetic mean roughness Ra.

5. The electrostatic chuck according to claim 3, wherein the base member is formed of aluminum, Cu, Al alloy, Cu alloy, Cu alloy or porous ceramic body provided with openings filled with aluminum.

* * * * *